United States Patent
Wu et al.

(10) Patent No.: US 10,629,572 B2
(45) Date of Patent: Apr. 21, 2020

(54) ELECTRONIC PACKAGE AND METHOD FOR FABRICATING THE SAME

(71) Applicant: Siliconware Precision Industries Co., Ltd., Taichung (TW)

(72) Inventors: Chi-Rui Wu, Taichung (TW); Fu-Tang Huang, Taichung (TW); Chia-Cheng Chen, Taichung (TW); Chun-Hsien Lin, Taichung (TW); Hsuan-Hao Mi, Taichung (TW); Yu-Cheng Pai, Taichung (TW)

(73) Assignee: Silicon Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/938,271

(22) Filed: Mar. 28, 2018

(65) Prior Publication Data

US 2019/0164941 A1 May 30, 2019

(30) Foreign Application Priority Data

Nov. 30, 2017 (TW) .............................. 106141864 A

(51) Int. Cl.
*H01L 23/02* (2006.01)
*H01L 25/10* (2006.01)
(Continued)

(52) U.S. Cl.
CPC ............ *H01L 25/105* (2013.01); *H01L 23/24* (2013.01); *H01L 23/49816* (2013.01); *H01L 23/49833* (2013.01); *H01L 23/49894* (2013.01); *H01L 25/50* (2013.01); *H01L 23/3128* (2013.01); *H01L 24/16* (2013.01); *H01L 24/48* (2013.01); *H01L 2224/0401* (2013.01); *H01L 2224/04042* (2013.01); *H01L 2224/16227* (2013.01);
(Continued)

(58) Field of Classification Search
CPC ..... H01L 2224/32145; H01L 2924/181; H01L 25/3128; H01L 2224/16145; H01L 2924/18161; H01L 23/49833
USPC .................................................. 257/686, 777
See application file for complete search history.

(56) References Cited

U.S. PATENT DOCUMENTS 7,309,913 B2 * 12/2007 Shim .................... H01L 25/0657
257/686
8,916,875 B2 * 12/2014 Lee .................... H01L 23/49838
257/48
(Continued)

*Primary Examiner* — S. V. Clark
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, including: a first substrate having a first insulating portion; a first electronic component disposed on the first substrate; a second substrate having a second insulating portion and stacked on the first substrate through a plurality of conductive elements; and a first encapsulant formed between the first substrate and the second substrate. The first insulating portion of the first substrate differs in rigidity from the second insulating portion of the second substrate. As such, during a high temperature process, one of the first substrate and the second substrate pulls at the other to bend toward the same direction, thereby reducing warpage deviation of the overall electronic package. The present invention further provides a method for fabricating the electronic package.

12 Claims, 3 Drawing Sheets

(51) Int. Cl.
  *H01L 23/498* (2006.01)
  *H01L 25/00* (2006.01)
  *H01L 23/24* (2006.01)
  H01L 23/31 (2006.01)
  H01L 23/00 (2006.01)

(52) U.S. Cl.
  CPC ............ *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/83191* (2013.01); *H01L 2224/92225* (2013.01); *H01L 2224/97* (2013.01); *H01L 2225/0651* (2013.01); *H01L 2225/06517* (2013.01); *H01L 2225/06572* (2013.01); *H01L 2225/1023* (2013.01); *H01L 2225/1041* (2013.01); *H01L 2225/1058* (2013.01); *H01L 2924/1533* (2013.01); *H01L 2924/15311* (2013.01); *H01L 2924/15331* (2013.01); *H01L 2924/181* (2013.01); *H01L 2924/3511* (2013.01)

(56) References Cited

U.S. PATENT DOCUMENTS

| | | | | |
|---|---|---|---|---|
| 9,041,180 B2* | 5/2015 | Lee | ............... | H01L 23/564 |
| | | | | 257/685 |
| 9,230,935 B2* | 1/2016 | Lin | ............... | H01L 25/074 |
| 2019/0081027 A1* | 3/2019 | Kumar | ............... | H04W 4/80 |

* cited by examiner

ELECTRONIC PACKAGE AND METHOD FOR FABRICATING THE SAME

CROSS-REFERENCE TO RELATED APPLICATION

This Application claims priority under 35 U.S.C. § 119(a) the benefit of Taiwanese Patent Application No. 106141864 filed on Nov. 30, 2017, the entire contents of which are incorporated herein by reference.

BACKGROUND

1. Technical Field

The present invention relates to package structures, and, more particularly, to an electronic package and a method for fabricating the same.

2. Description of Related Art

Along with the rapid development of portable electronic products, related products have been developed toward the trend of high density, high performance and miniaturization. Accordingly, various package on package (PoP) technologies have been developed to meet the requirements of high density and miniaturization.

FIG. 1 is a schematic cross-sectional view of a conventional PoP electronic package 1. The electronic package 1 has a first package structure 1a, a second package structure 1b stacked on the first package structure 1a, and an encapsulant 13 formed between the first package structure 1a and the second package structure 1b. The first package structure 1a has a first substrate 10, a first electronic component 11, such as a semiconductor chip bonded to the first substrate 10 through a plurality of conductive bumps 110 in a flip-chip manner, and an underfill 111 encapsulating the conductive bumps 110. The second package structure 1b has a second substrate 12, a plurality of second electronic components 14, such as semiconductor chips bonded to the second substrate 12 through a plurality of conductive bumps 140 in a flip-chip manner, and an underfill 141 encapsulating the conductive bumps 140. To fabricate the electronic package 1, the second substrate 12 is supported on and electrically connected to the first substrate 10 through a plurality of solder balls 120, and then the encapsulant 13 is formed between the first substrate 10 and the second substrate 12 to encapsulate the solder balls 120 and the first electronic component 11. Subsequently, the second electronic components 14 are disposed on the second substrate 12. In the conventional fabrication process, the insulating material of the first substrate 10 and the second substrate 12 has a low coefficient of thermal expansion (CTE) and high rigidity to reduce warping of the overall electronic package 1.

However, since the first substrate 10 and the second substrate 12 have different thicknesses d1, d2 and different configurations (for example, different circuit or chip arrangements), during a high temperature process, the first substrate 10 and the second substrate 12 pull at each other and hence bend toward different directions (shown in dashed lines of FIG. 1), thereby increasing warpage deviation of the overall electronic package 1.

Therefore, there is a need to provide an electronic package and a fabrication method thereof so as to overcome the above-described drawbacks.

SUMMARY

In view of the above-described drawbacks, the present invention provides an electronic package, which comprises: a first substrate having a first insulating portion; a first electronic component disposed on the first substrate; a second substrate having a second insulating portion and stacked on the first substrate through a plurality of conductive elements, wherein the first insulating portion differs in rigidity from the second insulating portion; and a first encapsulant formed between the first substrate and the second substrate to encapsulate the first electronic component and the conductive elements.

The present invention further provides a method for fabricating an electronic package, which comprises: providing a first substrate having a first insulating portion and a second substrate having a second insulating portion, wherein a first electronic component is disposed on the first substrate, and the first insulating portion differs in rigidity from the second insulating portion; stacking the second substrate on the first substrate through a plurality of conductive elements; and forming a first encapsulant between the first substrate and the second substrate to encapsulate the first electronic component and the conductive elements.

In an embodiment, the first insulating portion is more or less rigid than the second insulating portion.

In an embodiment, the conductive elements are metal bumps. In another embodiment, each of the conductive elements comprises a metal bump and a conductive material encapsulating the metal bump.

In an embodiment, the conductive elements are solder bumps.

In an embodiment, a supporting member is disposed between the first substrate and the second substrate, and is free from electrically connecting the first substrate and the second substrate.

In an embodiment, a second electronic component is disposed on the second substrate, and a second encapsulant is formed on the second substrate to encapsulate the second electronic component.

In an embodiment, a package is disposed on the second substrate.

In an embodiment, a less rigid one of the first insulting portion and the second insulating portion is made of an epoxy resin insulating film (such as Ajinomoto Build-up Film (ABF)), polyimide or a photo-sensitive dielectric layer.

In an embodiment, a more rigid one of the first insulting portion and the second insulating portion is made of prepreg.

In an embodiment, one of the first insulating portion and the second insulating portion has a Young's modulus less than 15 GPa, and the other has a Young's modulus greater than 15 GPa.

In an embodiment, one of the first insulating portion and the second insulating portion has a Young's modulus between 2.5 and 15 GPa.

In an embodiment, one of the first insulating portion and the second insulating portion has a Young's modulus greater than 20 GPa.

According to the present invention, since the first insulating portion of the first substrate differs in rigidity from the second insulating portion of the second substrate, during a high temperature process, one of the first substrate and the second substrate pulls at the other to bend toward the same direction. Compared with the prior art, the present invention reduces warpage deviation of the overall electronic package.

DETAILED DESCRIPTION OF EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "a" etc. are merely for illustrative purposes and should not be construed to limit the scope of the present invention.

Figure 1:
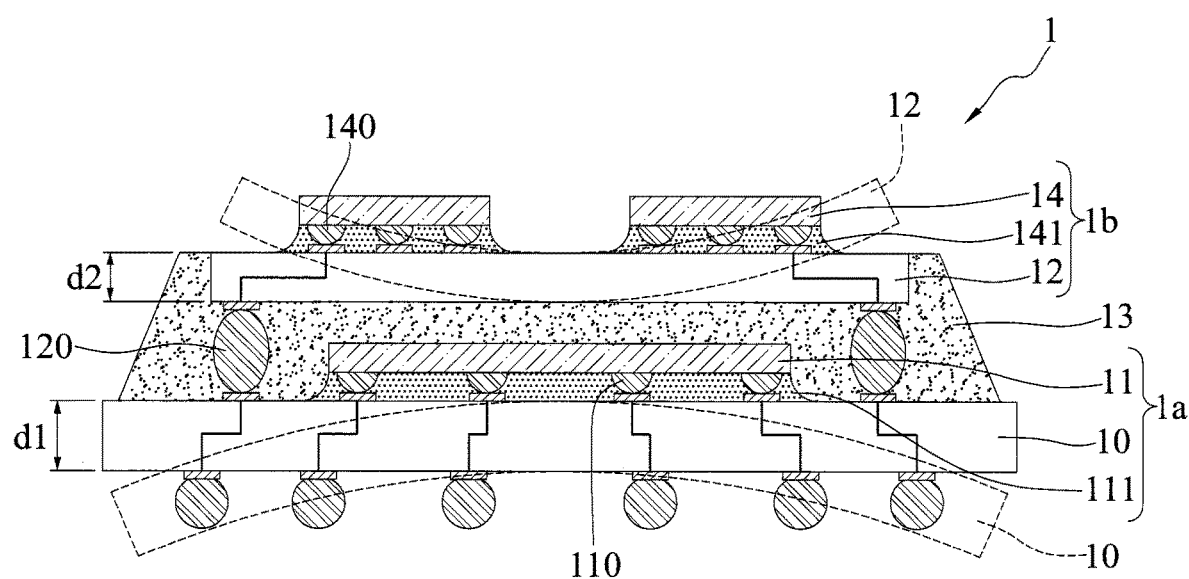
FIG. 1 is a schematic cross-sectional view of a conventional PoP electronic package.
Figure 2A:
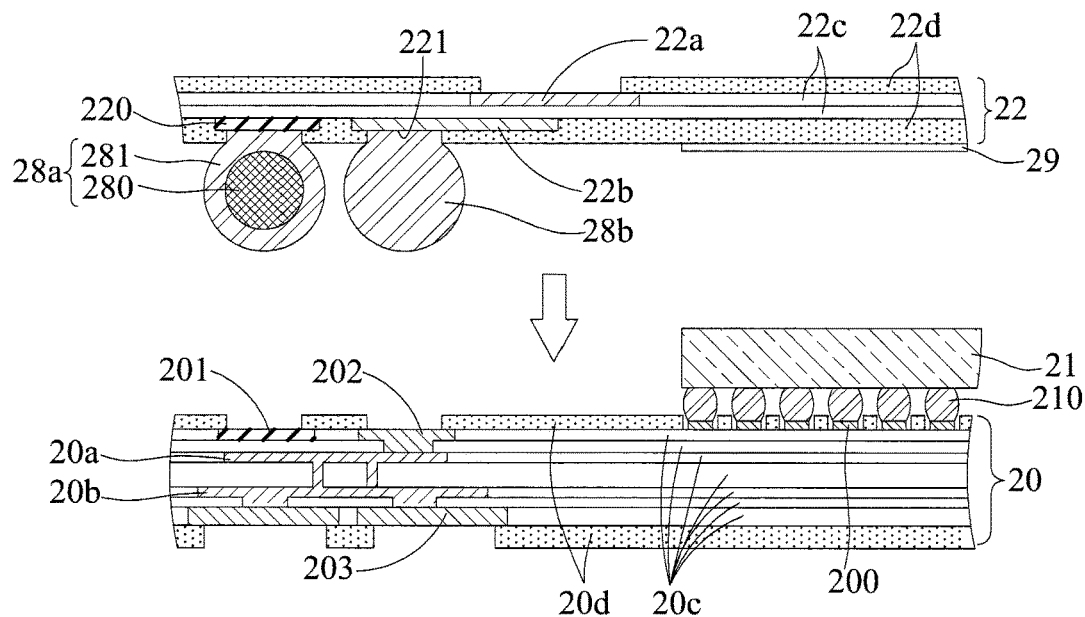
FIGS. 2A to 2C are schematic cross-sectional views showing a method for fabricating an electronic package according to the present invention, wherein FIG. 2B' shows another embodiment of FIG. 2B.
Figure 2B:
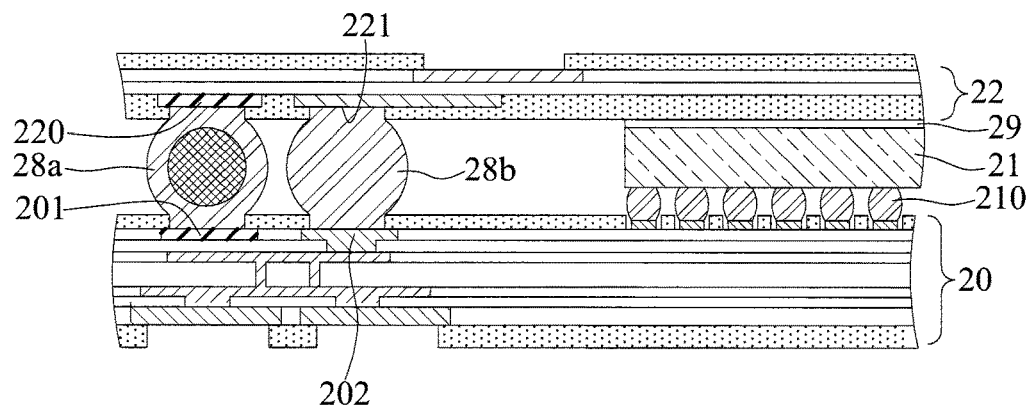
Figure 2B:
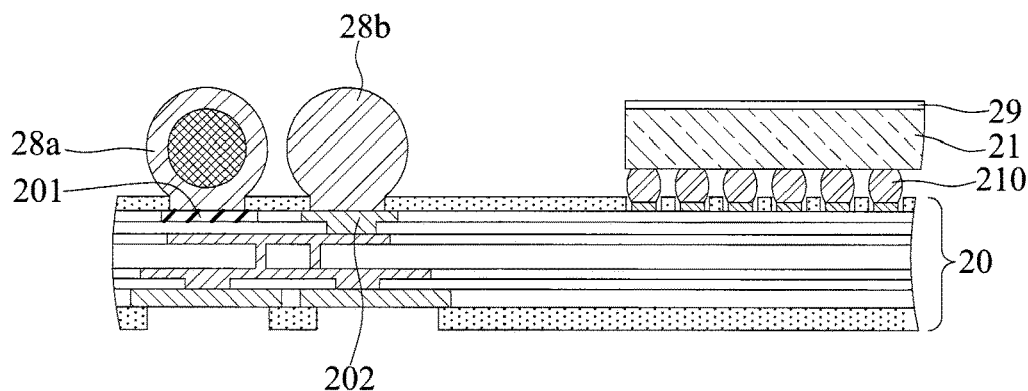
Figure 2C:
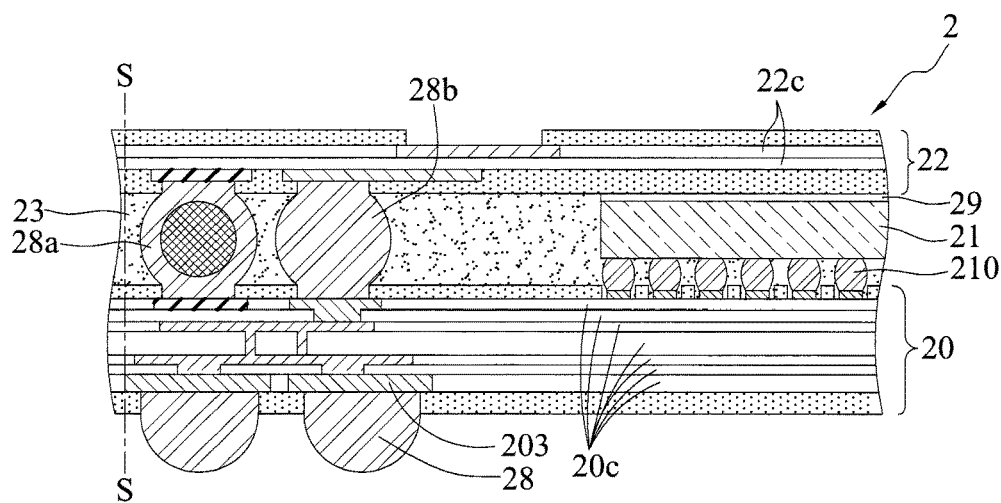

FIGS. 2A to 2C are schematic cross-sectional views showing a method for fabricating an electronic package 2 according to the present invention.

Referring to FIG. 2A, a first substrate 20 and a second substrate 22 are provided. At least a first electronic component 21 is disposed on the first substrate 20. A plurality of first conductive elements 28a, a plurality of second conductive elements 28b and a bonding layer 29, such as a thin film or a heat dissipating material, are formed on a lower side of the second substrate 22.

In an embodiment, the first substrate 20 and the second substrate 22 are circuit boards. The first substrate 20 has a first insulating portion 20c and a plurality of first circuit layers 20a, 20b bonded to the first insulating portion 20c. The first circuit layers 20a, 20b have a plurality of first conductive pads 200, a plurality of electrical contacts 201, 202, and a plurality of second conductive pads 203. The second substrate 22 has a second insulating portion 22c and a plurality of second circuit layers 22a, 22b. The second circuit layers 22a, 22b have a plurality of electrical contacts 220, 221. The first insulating portion 20c (not including a solder material 20d) is made of a dielectric material having a low CTE and high rigidity (having a Young's modulus above 15 GPa, preferably above 20 GPa). In an embodiment, the first insulating portion 20c is made of prepreg (having a Young's modulus between about 15 and 27 GPa). The second insulating portion 22c (not including a solder material 22d) is made of a dielectric material having a low CTE and low rigidity (having a Young's modulus below 15 GPa, preferably between 2.5 and 15 GPa). In an embodiment, the second insulating portion 22c is made of an epoxy resin insulating film (such as Ajinomoto Build-up Film (ABF) (having a Young's modulus between about 4 and 13 GPa)), polyimide (having a Young's modulus of about 2.5 GPa) or a photo-sensitive dielectric layer (having a Young's modulus between about 3 and 4 GPa).

Further, the first electronic component 21 is disposed in a flip-chip manner on the first conductive pads 200 of an upper side of the first substrate 20 through a plurality of conductive bumps 210.

Furthermore, the first conductive elements 28a are disposed on the electrical contacts 220 of the lower side of the second substrate 22. Each of the first conductive elements 28a has a metal bump 280 and a conductive material 281 encapsulating the metal bump 280. In an embodiment, each of the first conductive elements 28a only has the metal bump 280 (not including the conductive material 281). In an embodiment, the metal bump 280 is a copper ball or a copper post. In another embodiment, the conductive material 281 is a solder material, such as Ni—Sn, Sn—Pb or Sn—Ag.

In addition, the second conductive elements 28b are disposed on the electrical contacts 221 of the lower side of the second substrate 22. The second conductive elements 28b are solder bumps.

Referring to FIG. 2B, the second substrate 22 is stacked on the first substrate 20. In an embodiment, the second substrate 22 is bonded to the first electronic component 21 through the bonding layer 29, and the first conductive element 28a and the second conductive element 28b are electrically connected to the electrical contacts 201, 202 of the first substrate 20 so as to electrically connect the second substrate 22 to the first substrate 20.

In another embodiment, referring to FIG. 2B', the bonding layer 29 is formed on the first electronic component 21. Further, the first conductive element 28a and the second conductive element 28b are disposed on the electrical contacts 201, 202 of the first substrate 20. Then, the second substrate 22 is stacked on the first substrate 20 to obtain the structure of FIG. 2B.

Referring to FIG. 2C, a first encapsulant 23 is formed between the upper side of the first substrate 20 and the lower side of the second substrate 22 to encapsulate the first electronic component 21, the first conductive elements 28a, the second conductive elements 28b, the bonding layer 29 and the conductive bumps 210.

Then, a singulation process is performed along paths S to obtain a plurality of electronic packages 2.

In an embodiment, the first encapsulant 23 is not filled between the second substrate 22 and the first electronic component 21 due to the bonding layer 29 formed therebetween.

Further, a plurality of conductive elements, such as solder balls 28, are disposed on the second conductive pads 203 of the lower side of the first substrate 20 for connection of a circuit board or other electronic structures.

Figure 2D:
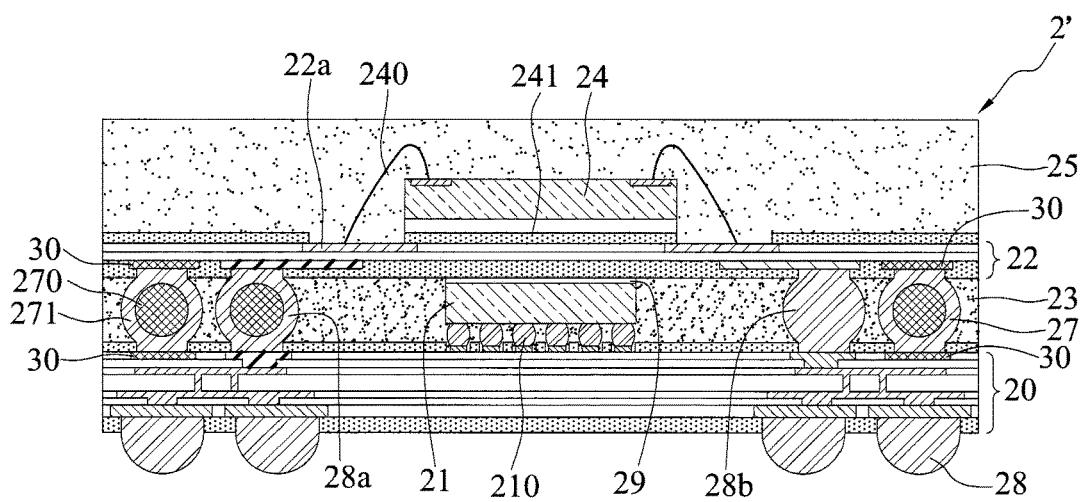
FIGS. 2D and 2D' are schematic cross-sectional views showing other embodiments of FIG. 2C.
Figure 2D:
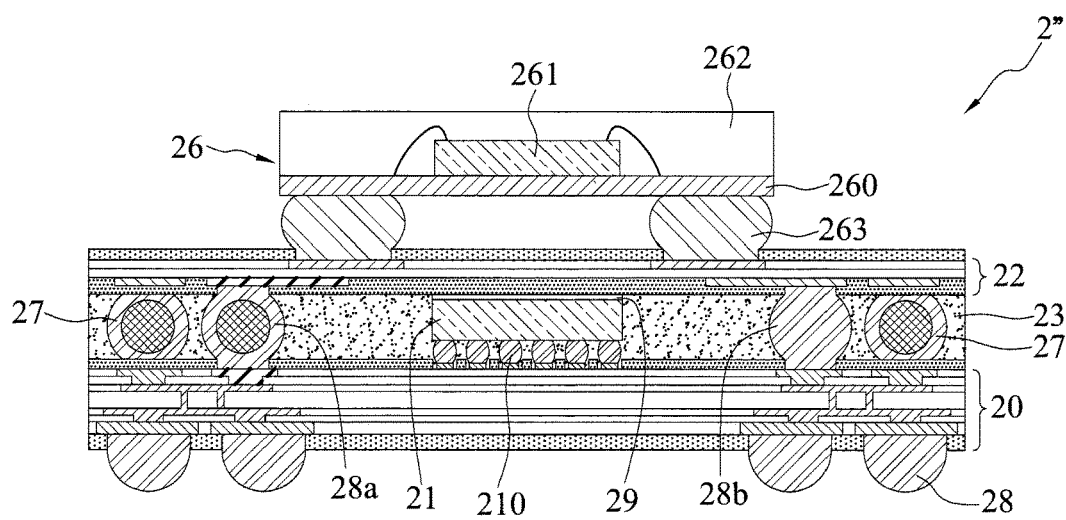

In another embodiment, in the electronic package 2' of FIG. 2D, at least a second electronic component 24 is disposed on the upper side of the second substrate 22 through an adhesive layer 241, and a second encapsulant 25 is formed on the upper side of the second substrate 22 to encapsulate the second electronic component 24. In an embodiment, the second electronic component 24 is electrically connected to the second circuit layer 22a of the upper side of the second substrate 22 through a plurality of bonding wires 240, and the second encapsulant 25 further encapsulates the bonding wires 240. In another embodiment, the second electronic component 24 can be disposed on the upper side of the second substrate 22 in a flip-chip manner.

In a further embodiment, in the electronic package 2" of FIG. 2D', at least a package 26 is disposed on the second substrate 22. In an embodiment, the package 26 has a carrier 260, a third electronic component 261 disposed on and electrically connected to the carrier 260, and an encapsulant 262 encapsulating the third electronic component 261. In another embodiment, the package 26 is electrically connected to the second substrate 22 through a plurality of conductive elements, such as solder balls 263. The third electronic component 261 can be disposed on the carrier 260 through wire bonding (as shown in FIG. 2D') in a flip-chip manner or embedded in the carrier 260.

In another embodiment, referring to FIG. 2D, at least a supporting element 27 is disposed between the first substrate 20 and the second substrate 22 to support the second substrate 22 on the first substrate 20. The supporting member 27 is also encapsulated by the first encapsulant 23.

In an embodiment, the supporting member 27 has a similar structure to the first conductive elements 28a. That is, the supporting member 27 also has a metal bump 270 and a conductive material 271 encapsulating the metal bump 270. The metal bump 270 is a copper ball, and the conductive material 271 is a solder material, such as Ni—Sn, Sn—Pb or Sn—Ag.

Further, the supporting member 27 can be fabricated together with the first conductive elements 28a. The first substrate 20 and the second substrate 22 can be provided with positioning pads 30 to facilitate positioning of the supporting member 27. In an embodiment, the positioning pads 30 are not electrically connected to the first circuit layers 20a, 20b of the first substrate 20 or the second circuit layers 22a, 22b of the second substrate 22. Therefore, the supporting member 27 is free from electrically connecting the first substrate 20 and the second substrate 22 and can be regarded as a dummy metal member. Referring to FIG. 2D', the positioning pads 30 can be omitted and the supporting member 27 can be directly formed on surfaces of the first substrate 20 and the second substrate 22.

Furthermore, each of the above-described electronic components (the first electronic component 21, the second electronic component 24 or the third electronic component 261) is an active element, such as a semiconductor chip, a passive element, such as a resistor, a capacitor or an inductor, or a combination thereof.

According to the present invention, since the first insulating portion 20c of the first substrate 20 differs in rigidity from (more rigid than) the second insulating portion 22c of the second substrate 22, during a high temperature process, the first substrate 20 pulls at the second substrate 22 to bend toward the same direction. Compared with the prior art, the present invention reduces warpage deviation of the overall electronic package 2, 2', 2" during the high temperature process.

In another embodiment, the first insulating portion 20c of the first substrate 20 is less rigid than the second insulating portion 22c of the second substrate 22. As such, during the high temperature process, the second substrate 22 pulls at the first substrate 20 to bend toward the same direction.

The present invention further provides an electronic package 2, 2', 2", which has: a first substrate 20 having a first insulating portion 20c; a first electronic component 21 disposed on the first substrate 20; a second substrate 22 stacked on the first substrate 20 through a plurality of first conductive elements 28a and a plurality of second conductive elements 28b; and a first encapsulant 23 formed between the first substrate 20 and the second substrate 22.

In an embodiment, the first electronic component 21 is disposed on the first substrate 20 through a plurality of conductive bumps 210.

In an embodiment, the second substrate 22 has a second insulating portion 22c differing in rigidity from the first insulating portion 20c. The second substrate 22 is electrically connected to the first substrate 20 through the first conductive elements 28a and the second conductive elements 28b. The first conductive element 28a are metal bumps or each has a metal bump 280 and a conductive material 281 encapsulating the metal bump 280, and the second conductive elements 28b are solder bumps.

In an embodiment, the first encapsulant 23 encapsulate the first electronic component 21, the first conductive elements 28a and the second conductive elements 28b.

In an embodiment, the electronic package 2', 2" further has at least a supporting member 27 disposed between the first substrate 20 and the second substrate 22. In another embodiment, the supporting member 27 is free from electrically connecting the first substrate 20 and the second substrate 22.

In an embodiment, the electronic package 2' further has a second electronic component 24 disposed on the second substrate 22 and a second encapsulant 25 encapsulating the second electronic component 24.

In an embodiment, the electronic package 2" further has at least a package 26 disposed on the second substrate 22.

In an embodiment, the first insulating portion 20c has a high rigidity and is made of prepreg.

In an embodiment, the second insulting portion 22c has a low rigidity and is made of an epoxy resin insulating film (such as Ajinomoto Build-up Film (ABF)), polyimide or a photo-sensitive dielectric layer.

In an embodiment, the first insulating portion 20c has a Young's modulus greater than 15 GPa, and the second insulating portion 22c has a Young's modulus less than 15 GPa.

In an embodiment, the first insulating portion 20c has a Young's modulus greater than 20 GPa.

In an embodiment, the second insulating portion 22c has a Young's modulus between 2.5 and 15 GPa.

According to the present invention, since the first insulating portion of the first substrate differs in rigidity from the second insulating portion of the second substrate, during a high temperature process, one of the first substrate and the second substrate pulls at the other to bend toward the same direction. Compared with the prior art, the present invention reduces warpage deviation of the overall electronic package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:
1. An electronic package, comprising:
a first substrate having a first insulating portion;
a first electronic component disposed on the first substrate;
a second substrate having a second insulating portion and stacked on the first substrate through a plurality of conductive elements, wherein the first insulating portion differs in rigidity from the second insulating portion, and one of the first insulating portion and the second insulating portion has a Young's modulus less than 15 GPa, and the other has a Young's modulus greater than 15 GPa; and
a first encapsulant formed between the first substrate and the second substrate and encapsulating the first electronic component and the conductive elements.

2. The electronic package of claim 1, wherein the first insulating portion is more or less rigid than the second insulating portion.

3. The electronic package of claim 1, wherein each of the conductive elements is metal bump or solder bump, or has a metal bump and a conductive material encapsulating the metal bump.

4. The electronic package of claim 1, further comprising a supporting member disposed between the first substrate and the second substrate.

5. The electronic package of claim 4, wherein the supporting member is free from electrically connecting the first substrate and the second substrate.

6. The electronic package of claim 1, further comprising a second electronic component disposed on the second substrate.

7. The electronic package of claim 6, further comprising a second encapsulant formed on the second substrate and encapsulating the second electronic component.

8. The electronic package of claim 1, further comprising a package disposed on the second substrate.

9. The electronic package of claim 1, wherein a less rigid one of the first insulting portion and the second insulating portion is made of an epoxy resin insulating film, polyimide or a photo-sensitive dielectric layer, and wherein the epoxy resin insulating film is Ajinomoto Build-up Film.

10. The electronic package of claim 1, wherein a more rigid one of the first insulting portion and the second insulating portion is made of prepreg.

11. The electronic package of claim 1, wherein the one of the first insulating portion and the second insulating portion has a Young's modulus of at least 2.5 but less than 15 GPa.

12. The electronic package of claim 1, wherein one the other of the first insulating portion and the second insulating portion has a Young's modulus greater than 20 GPa.

* * * * *